(12) United States Patent
Okada

(10) Patent No.: US 7,432,595 B2
(45) Date of Patent: Oct. 7, 2008

(54) SYSTEM AND METHOD TO REDUCE METAL SERIES RESISTANCE OF BUMPED CHIP

(75) Inventor: David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 0 days.

(21) Appl. No.: 10/581,657

(22) PCT Filed: Dec. 3, 2004

(86) PCT No.: PCT/US2004/040698

§ 371 (c)(1),
(2), (4) Date: Jun. 7, 2007

(87) PCT Pub. No.: WO2005/057626

PCT Pub. Date: Jun. 23, 2006

(65) Prior Publication Data

US 2007/0278675 A1    Dec. 6, 2007

Related U.S. Application Data

(60) Provisional application No. 60/527,463, filed on Dec. 4, 2003.

(51) Int. Cl.
*H01L 23/48* (2006.01)
(52) U.S. Cl. .................. 257/737; 257/738; 257/778
(58) Field of Classification Search ............. 438/614; 257/737, 738, 778
See application file for complete search history.

(56) References Cited

U.S. PATENT DOCUMENTS

| 5,904,859 | A | 5/1999 | Degani | |
|---|---|---|---|---|
| 6,586,323 | B1 * | 7/2003 | Fan et al. | 438/614 |
| 6,617,655 | B1 | 9/2003 | Estacio et al. | |
| 6,621,164 | B2 * | 9/2003 | Hwang et al. | 257/738 |
| 6,787,903 | B2 | 9/2004 | Yang et al. | |
| 6,800,932 | B2 | 10/2004 | Lam et al. | |
| 6,936,923 | B2 * | 8/2005 | Lin et al. | 257/750 |
| 6,972,464 | B2 | 12/2005 | Shen | |
| 2003/0067073 | A1 | 4/2003 | Akram et al. | |

OTHER PUBLICATIONS

International Search Report for PCT/US04/040698, dated Aug. 8, 2005 (2 pgs.).
Written Opinion of the International Searching Authority for PCT/US04/040698, dated Aug. 8, 2005 (4 pgs.).

* cited by examiner

*Primary Examiner*—Roy K Potter
(74) *Attorney, Agent, or Firm*—Goodwin Procter LLP

(57) ABSTRACT

Provided herein, in accordance with one aspect of the present invention, are exemplary embodiments of semiconductor chips having low metallization series resistance. In one embodiment, the semiconductor chip comprises a semiconductor substrate and a metallization structure formed on the semiconductor substrate; an under bump metallurgy ("UBM") structure layer formed over the metallization structure; and a bump formed over said UBM layer; wherein the largest linear dimension of said UBM layer is larger than the diameter of said bump.

14 Claims, 5 Drawing Sheets

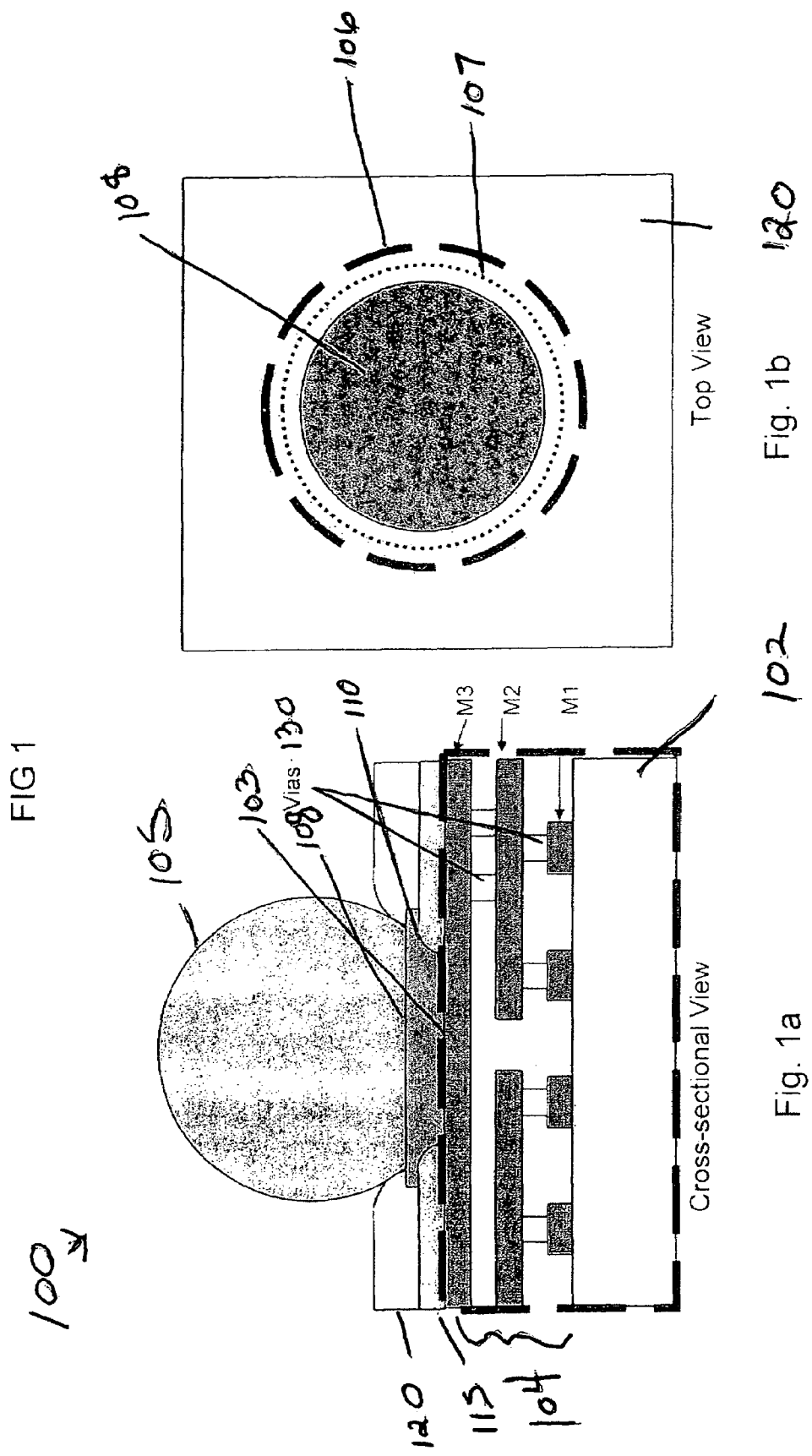

Common UBM (under bump metallurgy) Systems

FIG. 2. UBM Layer Covering Standard Top Metal Layer

Top View

Cross-sectional View

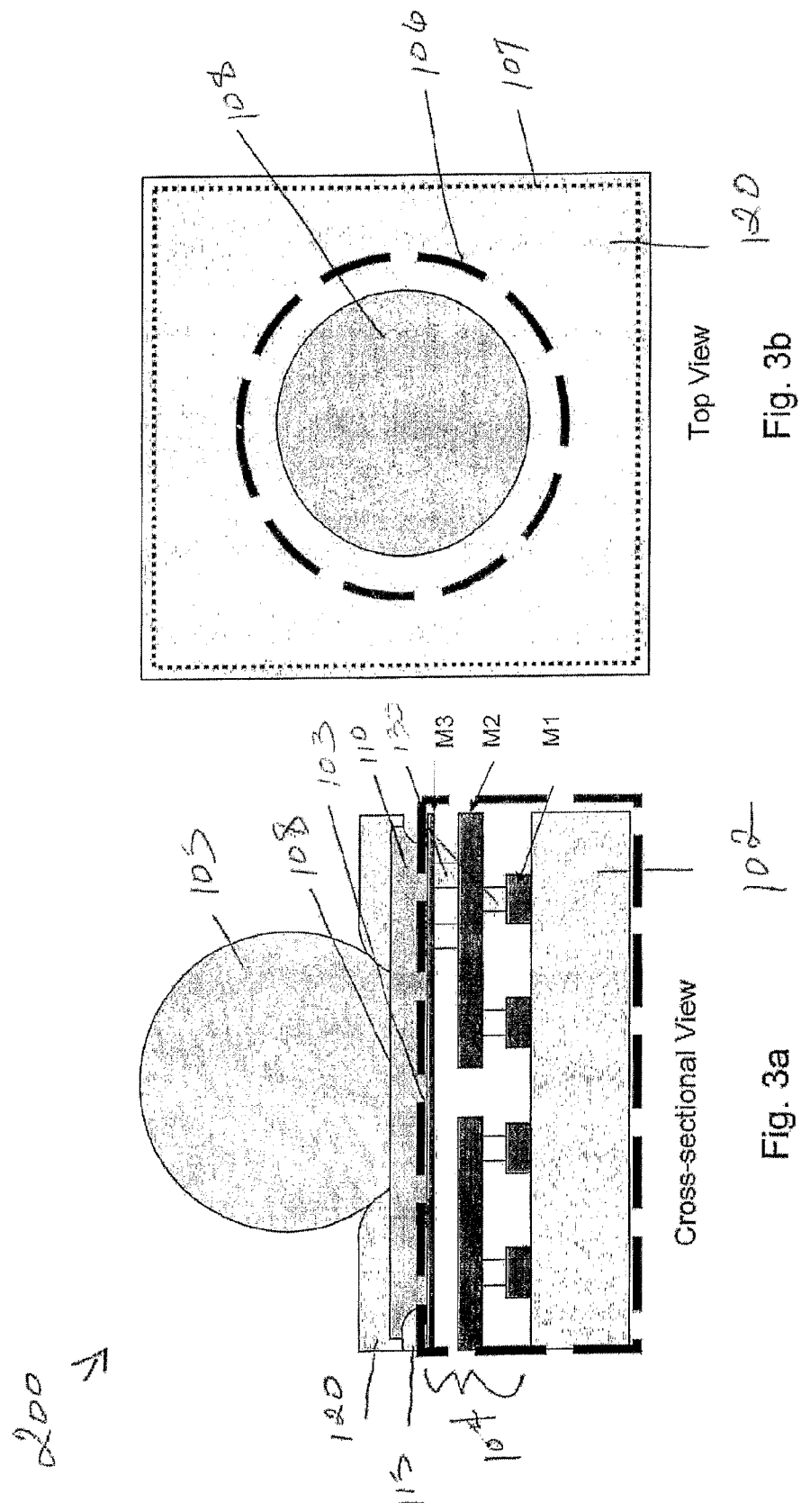
FIG 3. UBM Layer Covering Thinner Top Metal Layer
Fig. 3a — Cross-sectional View
Fig. 3b — Top View

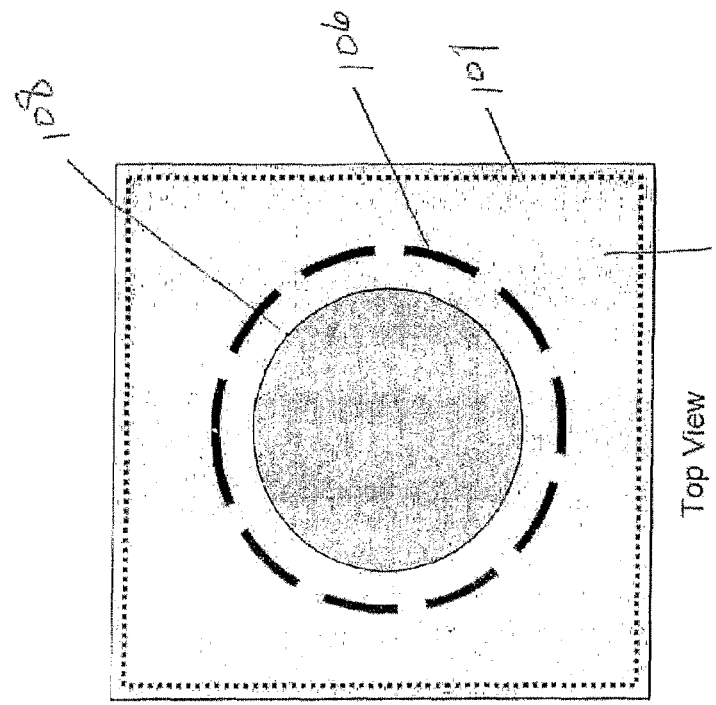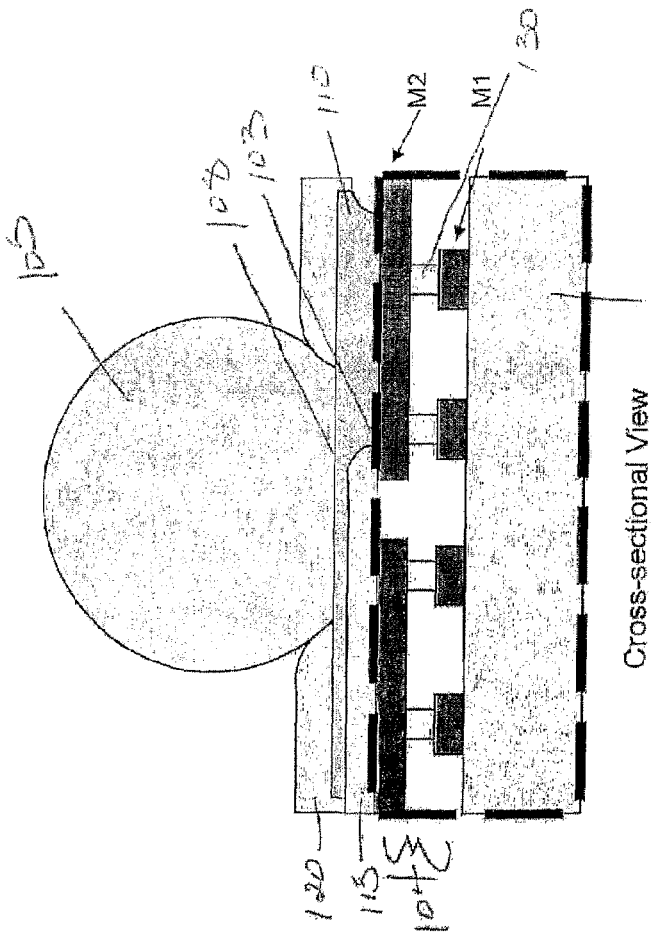
FIG. 4. UBM Layer Replacing Top Metal Layer

SYSTEM AND METHOD TO REDUCE METAL SERIES RESISTANCE OF BUMPED CHIP

CROSS-REFERENCE TO RELATED APPLICATIONS

This application is the U.S. national stage application of International (PCT) Patent Application Serial No. PCT/US2004/040698, filed Dec. 3, 2004, which claims the benefit of priority to U.S. Application No. 60/527,463, filed Dec. 4, 2003. The entire disclosures of these two applications are hereby incorporated by reference in their entirety.

STATEMENT REGARDING FEDERALLY SPONSORED RESEARCH OR DEVELOPMENT

Not applicable

REFERENCE OF A "MICROFICHE APPENDIX"

Not applicable

BACKGROUND OF THE INVENTION

1. Field of Invention

The present invention relates generally to a semiconductor chip having an under bump metallurgy ("UBM") structure and a plurality of pattern metallization layers, and more particularly, to a bumped semiconductor chip having low metallization series resistance and methods of fabricating the same.

2. Brief Description of the Prior Art

Semiconductor chip packages having an under bump metallurgy ("UBM") structure and a plurality of pattern metallization layers are well known in the art.

FIG. 1A-C: Prior Art

FIG. 1A illustrates a cross-sectional view of a prior art semiconductor chip 100 having a silicon substrate 102, a metal interconnect structure 104 comprising three aluminum layers, M1, M2 and M3, a passivation layer 115 having a plurality of openings 103, a bump passivation layer 120 ((typically of polyimide or benzocyclobutene) having a plurality of openings 108, a UBM structure 110 and a conductive bump 105, such as a solder "ball" bump or pillar bump.

The metal interconnect structure 104 is formed on top of the substrate 102. The passivation layer 115 (typically of silicon nitride or silicon dioxide) includes a plurality of openings 103 to expose portions of the top layer of the metal interconnect structure 104. In the embodiment shown, layer M1 contacts the substrate 102. Layer M3 contacts the UBM structure 110 via the opening 103 in the passivation layer 115. Layer M2 contacts layers M1 and M3 through a plurality of vias 130.

The UBM structure 110 is formed on each of the plurality of openings 103. Conventional UBM structures are approximately 2-5 μm thick and comprise two or three layers of conductive metals. As shown in FIG. 1C, in a 3-layer UBM structure, a bottom layer of a adhesive metal, such as aluminum, that is approximately 0.15 μm thick provides adhesion to the top aluminum layer. Then, a middle layer of a barrier metal, such as nickel/vanadium, that is approximately 0.15 μm thick is deposited over the bottom layer to serve as a barrier to prevent metal migration between the top and bottom layers. Finally, a top layer of a conductive solderable metal, such as copper or gold, that is approximately 1-5 μm thick is deposited over the middle layer to allow the solder bump 105 to be successfully bonded to the UBM structure 110.

In a two-layer UBM structure, a bottom layer of an adhesive metal, such as titanium or chromium, that is approximately 0.15 μm thick provides adhesion to the top aluminum layer. Then, a top layer of a conductive solderable metal, such as copper or gold, that is approximately 1-5 μm thick is deposited over the bottom layer to allow the solder bump 105 to be successfully bonded to the UBM structure 110.

The bump passivation layer 120 includes a plurality of openings 108 to expose the UBM structure 110. Finally, the solder bump 105 is formed on the exposed UBM structure 110 such that the largest linear dimension of the UBM structure 110 is smaller than the diameter of the solder bump 105.

FIG. 1B depicts a top view of the prior art semiconductor chip 100. Dotted line 106 indicates the circumference of the solder ball 105. Dotted line 107 indicates the portion of the UBM structure 110 that is partially covered by the bump passivation layer 120.

A bumped semiconductor chip is generally fabricated as follows: first, a semiconductor chip is prepared having aluminum layers (e.g., M1, M2 and M3) on the surface of the chip. Next, a passivation layer is applied over the surface of the chip, portions of which is selectively removed to create one or more openings to expose the top aluminum layer. Next, a UBM structure is formed on each of the exposed aluminum layer openings using conventional sputtering, plating and patterning processes. Next, a bump passivation layer is applied over the layered surface of the chip, portions of which is selectively removed to create one or more openings to expose the UBM structure. Finally, a solder bump or pillar is formed on each of the exposed UBM structures using conventional processes.

It should be apparent to those skilled in the art that the indicated materials and dimensions for the UBM structure are illustrative only and not limiting, having been presented by way of example—other metals and thicknesses may be used. Typically, the selection of materials and dimensions are predetermined by a particular manufacturer's process and usually can only be changed in a limited fashion, for example, specifying better conductivity, depending on the manufacturing process. Further details of prior art UBM processes can be found in, for example, U.S. Pat. Nos. 6,787,903 and 5,904,859.

When electrical current flows within the chip 100, each layer, M1, M2 and M3, imparts an electrical resistance and contributes to the overall electrical series resistance of a device using the chip. The added series resistance can degrade the performance of the device. To minimize the series resistance, present techniques increase the thickness of the metal layers or use a material with better conductivity/lower resistance. However, using thicker metal layers require longer processing time for deposition and etch, which in turn increases manufacturing costs. In addition, substituting metals with those having better conductivity/lower resistance, such as the standard aluminum with copper or gold, also increases processing complexity and cost because the use of copper or gold typically requires expensive specialized and/or dedicated equipment.

SUMMARY OF THE INVENTION

The present invention addresses the aforementioned limitations of the prior art by providing, in accordance with one aspect of the present invention, a semiconductor chip having low metallization series resistance. The semiconductor chip comprises a semiconductor substrate and a metallization structure formed on the semiconductor substrate; an under bump metallurgy ("UBM") structure layer formed over the metallization structure; a bump formed over said UBM layer; wherein the largest linear dimension of said UBM layer is larger than the diameter of said bump.

In accordance with another aspect of the present invention, the metallization structure further comprises a top metallization layer having the UBM layer formed thereover, wherein the vertical thickness of the top metallization layer is substantially smaller than said UBM layer.

These and other aspects, features and advantages of the present invention will become better understood with regard to the following description, appended claims, and accompanying drawings.

BRIEF DESCRIPTION OF THE DRAWINGS

Exemplary embodiments of the present invention are now briefly described with reference to the following drawings:

FIGS. 1A-C depict one aspect of the present invention in accordance with the teachings presented herein.

FIGS. 3A-B depict a third aspect of the present invention in accordance with the teachings presented herein.

FIGS. 4A-B depict a fourth aspect of the present invention in accordance with the teachings presented herein.

DESCRIPTION OF THE INVENTION

The aspects, features and advantages of the present invention will become better understood with regard to the following description with reference to the accompanying drawings. What follows are preferred embodiments of the present invention depicting a bumped semiconductor chip. It should be apparent to those skilled in the art that the foregoing is illustrative only and not limiting, having been presented by way of example only. All the features disclosed in this description may be replaced by alternative features serving the same purpose, such as a pillared semiconductor chip, and equivalents or similar purpose, unless expressly stated otherwise. Therefore, numerous other embodiments of the modifications thereof are contemplated as falling within the scope of the present invention as defined herein and equivalents thereto.

FIG. 2A-B

Figure 2B:
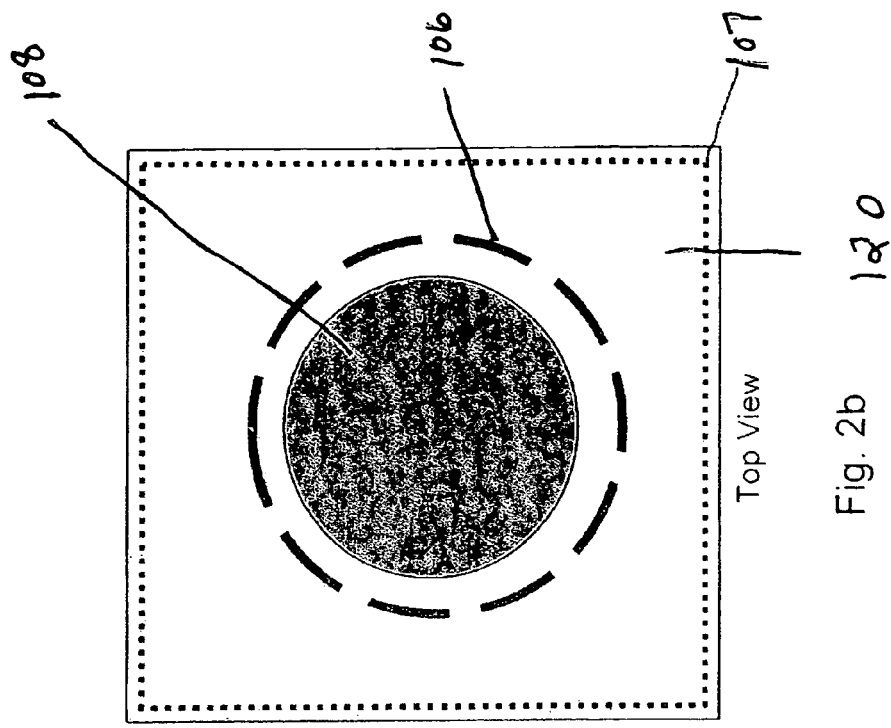
FIGS. 2A-B depict a second aspect of the present invention in accordance with the teachings presented herein.
Figure 2A:
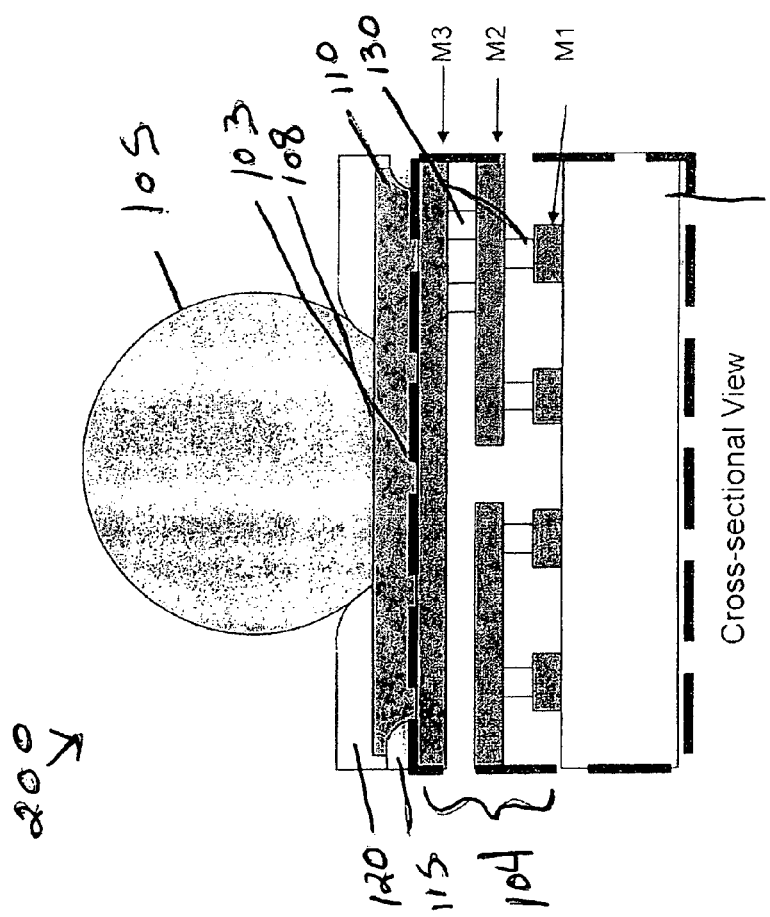

FIG. 2A depicts an exemplary embodiment of a semiconductor chip 200 having reduced metal series resistance, constructed in accordance with the present invention. As shown, the linear dimension of the UBM structure 110 is larger than the diameter of the solder bump 105 to contact a larger surface area of the top aluminum layer M3. In this embodiment, the large UBM structure 110 significantly reduces the resistance of the top aluminum layer M3 thereby reducing the metallization series resistance of the chip 100.

FIG. 2B depicts a top view of the present invention's semiconductor chip 200. Dotted line 106 indicates the circumference of the solder ball 105. Dotted line 107 indicates the portion of the UBM structure 110 that is partially covered by the bump passivation layer 120.

FIG. 3A-B

FIG. 3 depicts an alternative exemplary embodiment of a semiconductor chip 200 having reduced metal series resistance, constructed in accordance with the present invention. As in FIG. 2, the linear dimension of the UBM structure 110 is larger than the diameter of the solder bump 105 to contact a larger surface area of the top aluminum layer M3. Furthermore, the thickness of the top aluminum layer M3 is substantially smaller than the thickness of the UBM structure 110. The larger UBM structure 110, in greater contact with the top aluminum layer M3, compensates for the thinner top aluminum layer M3. In this embodiment, the large UBM structure 110 and the thin top aluminum layer M3 significantly reduces the resistance of the top aluminum layer M3 thereby reducing the metallization series resistance of the chip 100. Time, material and wafer processing costs are also reduced by using the thinner top aluminum layer M3.

FIG. 3B depicts a top view of the present invention's semiconductor chip 200. Dotted line 106 indicates the circumference of the solder ball 105. Dotted line 107 indicates the portion of the UBM structure 110 that is partially covered by the bump passivation layer 120.

FIG. 4A-B

Figure 1C:
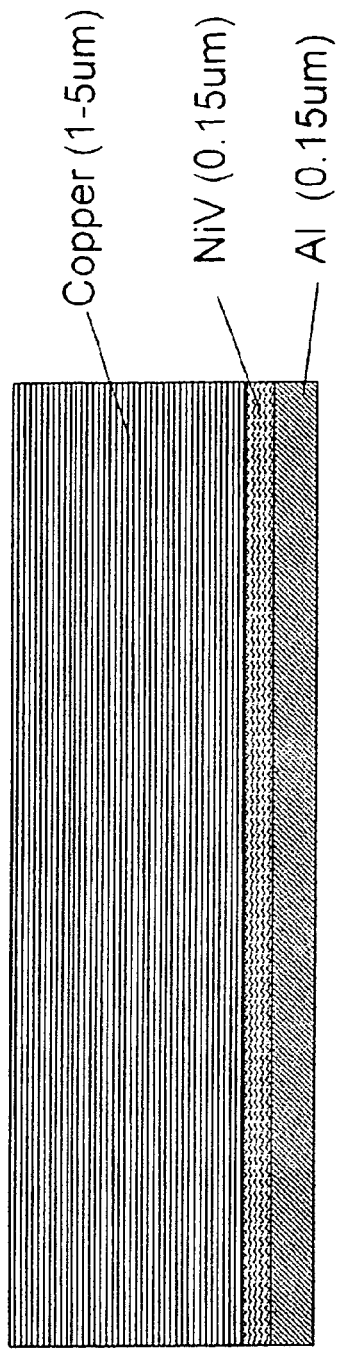
Figure 1C:
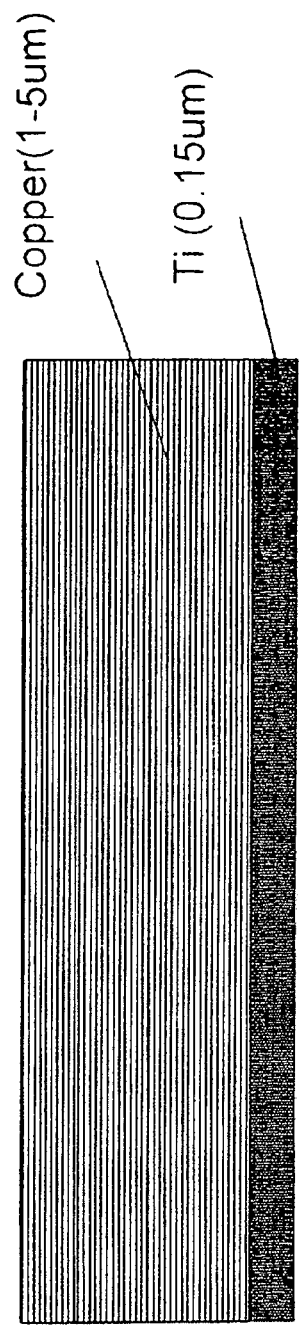

FIG. 4A depicts still another exemplary embodiment of a semiconductor chip 200 having reduced metallization series resistance and lower associated processing complexity and cost. As in FIGS. 2 and 3, the linear dimension of the UBM structure 110 is larger than the diameter of the solder bump 105. Here, however, the top aluminum layer M3 and associated M2-M3 vias of FIGS. 1-3 are eliminated. Instead, the UBM structure 110 functions as the top aluminum layer.

FIG. 4B depicts a top view of the present invention's semiconductor chip 200. Dotted line 106 indicates the circumference of the solder ball 105. Dotted line 107 indicates the portion of the UBM structure 110 that is partially covered by the bump passivation layer 120.

Chip 200 Fabrication Process

In general, the bumped semiconductor chip 200 may be fabricated as follows: first, a semiconductor substrate 102 is prepared having two or more aluminum layers (e.g., M1, M2 and M3) 104 on the surface of the substrate 102 using conventional techniques. For the embodiment shown in FIG. 3, the semiconductor substrate 102 is prepared with a thin top aluminum layer M3. Next, a passivation layer 115 is applied over the surface of the substrate with the aluminum layers, portions of which is selectively removed to create one or more openings 103 to expose the top aluminum layer. Next, a UBM structure 110 is formed on each of the exposed aluminum layer openings 103 using conventional sputtering, plating and patterning processes such that linear dimension of the UBM structure 110 will be larger than the diameter of a solder bump 105 that will be later formed on the UBM structure 110. Next, a bump passivation layer 120 is applied over the layered surface of the chip, portions of which is selectively removed to create one or more openings 108 to expose the UBM structure 110. Finally, a solder bump 105 is formed on each of the exposed UBM structures 110 using conventional processes

CONCLUSION

Having now described preferred embodiments of the invention, it should be apparent to those skilled in the art that the foregoing is illustrative only and not limiting, having been presented by way of example only. All the features disclosed in this specification (including any accompanying claims, abstract, and drawings) may be replaced by alternative features serving the same purpose, and equivalents or similar purpose, unless expressly stated otherwise. Therefore, numerous other embodiments of the modifications thereof are contemplated as falling within the scope of the present invention as defined by the appended claims and equivalents thereto.

What is claimed is:

1. A semiconductor device having low metallization series resistance, the semiconductor device comprising:
   a metallization structure formed on a semiconductor substrate;
   an under bump metallurgy (UBM) layer formed over said metallization structure; and
   a conductive bump formed directly over said UBM layer and directly over the metallization structure,
   wherein a largest linear dimension of said UBM layer is greater than a diameter of said conductive bump, said metallization structure comprises a top metallization layer, said UBM layer is formed over the top metallization layer, and a thickness of said top metallization layer is substantially smaller than a thickness of said UBM layer.

2. The semiconductor substrate as in claim 1 wherein said top metallization layer comprises aluminum.

3. The semiconductor device as in claim 1 wherein said UBM layer comprises (i) a bottom layer comprising a metal, said bottom layer adhering to said metallization structure, (ii) a middle layer comprising a barrier metal, and (iii) a top layer comprising a conductive solderable metal.

4. The semiconductor device as in claim 3 wherein said bottom layer metal comprises at least one of aluminum, titanium, and chromium.

5. The semiconductor device as in claim 3 wherein said barrier metal comprises nickel.

6. The semiconductor device as in claim 3 wherein said barrier metal comprises vanadium.

7. The semiconductor device as in claim 3 wherein said solderable conductive material comprises copper.

8. The semiconductor device as in claim 3 wherein said solderable conductive material comprises gold.

9. A semiconductor device having low metallization series resistance, the semiconductor device comprising:
   a top metallization layer formed on a semiconductor substrate;
   a UBM layer formed over said top metallization layer; the UBM layer comprising (i) a bottom layer comprising at least one of aluminum and chromium, said bottom layer adhering to said metallization structure, (ii) a middle layer comprising vanadium, and (iii) a top layer comprising a conductive solderable metal; and
   a conductive bump formed over said UBM layer
   wherein a thickness of said top metallization layer is substantially smaller than a thickness of said UBM layer, and a largest linear dimension of said UBM layer is greater than a diameter of said conductive bump.

10. A semiconductor device having low metallization series resistance, the semiconductor device comprising:
    a top metallization layer formed on a semiconductor substrate;
    a UBM layer formed over said top metallization layer; the UBM layer comprising (i) a bottom layer comprising at least one of aluminum and chromium, said bottom layer adhering to said metallization structure, (ii) a middle layer comprising vanadium, and (iii) a top layer comprising a conductive solderable metal; and
    a conductive bump formed over said UBM layer,
    wherein a thickness of said top metallization layer is substantially smaller than a thickness of said UBM layer, and a largest linear dimension of said UBM layer is greater than a diameter of said conductive bump and said top metallization layer comprises aluminum.

11. The semiconductor device as in claim 10 wherein said barrier metal comprises nickel.

12. The semiconductor device as in claim 10 wherein said conductive solderable metal comprises copper.

13. The semiconductor device as in claim 10 wherein said conductive solderable metal comprises gold.

14. The semiconductor device as in claim 1 wherein the UBM layer consists essentially of a single layer.

* * * * *